(12) United States Patent
Appelt et al.

(10) Patent No.: US 10,777,478 B2
(45) Date of Patent: Sep. 15, 2020

(54) SEMICONDUCTOR PACKAGE DEVICE FOR POWER DEVICE

(71) Applicant: Advanced Semiconductor Engineering, Inc., Kaohsiung (TW)

(72) Inventors: Bernd Karl Appelt, Kaohsiung (TW); Kay Stefan Essig, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/649,543

(22) Filed: Jul. 13, 2017

(65) Prior Publication Data

US 2018/0019175 A1   Jan. 18, 2018

Related U.S. Application Data

(60) Provisional application No. 62/363,130, filed on Jul. 15, 2016.

(51) Int. Cl.
*H01L 23/31* (2006.01)
*H01L 21/56* (2006.01)
(Continued)

(52) U.S. Cl.
CPC ........ *H01L 23/3135* (2013.01); *H01L 21/486* (2013.01); *H01L 21/561* (2013.01); *H01L 21/563* (2013.01); *H01L 21/568* (2013.01); *H01L 21/76805* (2013.01); *H01L 21/76879* (2013.01); *H01L 23/3128* (2013.01); *H01L 23/3142* (2013.01); *H01L 23/3157* (2013.01); *H01L 23/367* (2013.01); *H01L 23/481* (2013.01); *H01L 23/49827* (2013.01); *H01L 23/5384* (2013.01); *H01L 23/5389* (2013.01);
(Continued)

(58) Field of Classification Search
CPC ............. H01L 23/3135; H01L 23/3142; H01L 23/49827; H01L 2225/06548
See application file for complete search history.

(56) References Cited

U.S. PATENT DOCUMENTS 7,571,970 B2   8/2009   Nystrom et al.
7,745,941 B2   6/2010   Kuroda et al.
(Continued)

FOREIGN PATENT DOCUMENTS

CN   101071810 A   11/2007
CN   101334532 A   12/2008
(Continued)

OTHER PUBLICATIONS

Notice of Allowance for U.S. Appl. No. 15/649,545 dated Sep. 17, 2018.
(Continued)

*Primary Examiner* — Hoai V Pham
(74) *Attorney, Agent, or Firm* — Foley & Lardner LLP

(57) ABSTRACT

A semiconductor package device includes a first die having a first surface and a second surface opposite to the first surface, and a first adhesive layer disposed on the first surface of the first die. The semiconductor package device further includes an encapsulant layer encapsulating the first die and the first adhesive layer, and a first conductive via disposed in the first adhesive layer and electrically connected to the first die.

21 Claims, 14 Drawing Sheets

(51) Int. Cl.
    *H01L 23/538*     (2006.01)
    *H01L 23/00*     (2006.01)
    *H01L 21/48*     (2006.01)
    *H01L 23/498*     (2006.01)
    *H01L 25/065*     (2006.01)
    *H01L 21/768*     (2006.01)
    *H01L 23/367*     (2006.01)
    *H01L 23/48*     (2006.01)
    *H01L 23/14*     (2006.01)

(52) U.S. Cl.
    CPC .............. *H01L 24/19* (2013.01); *H01L 24/20* (2013.01); *H01L 24/24* (2013.01); *H01L 24/25* (2013.01); *H01L 24/27* (2013.01); *H01L 24/32* (2013.01); *H01L 24/82* (2013.01); *H01L 25/0655* (2013.01); *H01L 25/0657* (2013.01); *H01L 23/145* (2013.01); *H01L 23/3677* (2013.01); *H01L 2224/04105* (2013.01); *H01L 2224/06181* (2013.01); *H01L 2224/211* (2013.01); *H01L 2224/215* (2013.01); *H01L 2224/24137* (2013.01); *H01L 2224/2518* (2013.01); *H01L 2224/32146* (2013.01); *H01L 2224/32245* (2013.01); *H01L 2224/73267* (2013.01); *H01L 2224/92144* (2013.01); *H01L 2224/96* (2013.01); *H01L 2225/06524* (2013.01); *H01L 2225/06548* (2013.01); *H01L 2225/06582* (2013.01); *H01L 2924/01022* (2013.01); *H01L 2924/01029* (2013.01)

(56) References Cited

U.S. PATENT DOCUMENTS

| | | | |
|---|---|---|---|
| 7,759,777 B2 | 7/2010 | Otremba et al. | |
| 7,973,414 B2 | 7/2011 | Suh | |
| 8,030,131 B2 | 10/2011 | Otremba et al. | |
| 8,120,158 B2 | 2/2012 | Ewe et al. | |
| 8,294,276 B1 | 10/2012 | Kim et al. | |
| 8,871,630 B2 | 10/2014 | Otremba et al. | |
| 8,987,734 B2 | 3/2015 | Wang | |
| 9,048,209 B2* | 6/2015 | Oh | H01L 21/561 |
| 9,318,441 B2* | 4/2016 | Pagaila | H01L 21/561 |
| 2005/0139985 A1 | 6/2005 | Takahashi | |
| 2007/0085182 A1 | 4/2007 | Yamaguchi | |
| 2011/0140254 A1 | 6/2011 | Tsai et al. | |
| 2011/0204513 A1* | 8/2011 | Meyer | H01L 21/568 257/738 |
| 2013/0207255 A1 | 8/2013 | Magnus et al. | |
| 2014/0021629 A1* | 1/2014 | Chang | H01L 21/561 257/774 |
| 2015/0357255 A1* | 12/2015 | Lin | H01L 24/97 257/712 |
| 2016/0240465 A1* | 8/2016 | Chen | H01L 21/486 |
| 2017/0033026 A1* | 2/2017 | Ho | H01L 21/56 |

FOREIGN PATENT DOCUMENTS

| | | |
|---|---|---|
| CN | 101342813 A | 1/2009 |
| CN | 101369566 A | 2/2009 |
| CN | 104051392 A | 9/2014 |
| CN | 105271104 A | 1/2016 |

OTHER PUBLICATIONS

Office Action for corresponding Chinese Patent Application No. 201710574710.9, dated May 24, 2019, 6 pages.
Search Report for corresponding Chinese Patent Application No. 201710574710.9, dated May 24, 2019, 5 pages.

* cited by examiner

SEMICONDUCTOR PACKAGE DEVICE FOR POWER DEVICE

CROSS-REFERENCE TO RELATED APPLICATIONS

This application claims the benefit of and priority to U.S. Provisional Application No. 62/363,130, filed Jul. 15, 2016, the content of which is incorporated herein by reference in its entirety.

BACKGROUND

1. Technical Field

The present disclosure generally relates to a semiconductor package device and a method of manufacturing the same.

2. Description of the Related Art

A semiconductor device (e.g. a die or a chip) can be attached to a carrier and encapsulated by an encapsulant to form a semiconductor device package. To promote miniaturization, a cavity can be formed in the carrier to accommodate the semiconductor device. A protective film can be laminated to the semiconductor device and the carrier. A redistribution structure, which can be formed over the semiconductor device by, for example, a photolithography technique, a plating technique, or other appropriate technique, can be used for external connection. However, this process of manufacturing the semiconductor device package can be expensive. Moreover, such a process can involve highly accurate alignment and registration techniques.

SUMMARY

In one or more embodiments, according to one aspect of the present disclosure, a semiconductor package device includes a first die having a first surface and a second surface opposite to the first surface, and a first adhesive layer disposed on the first surface of the first die. The semiconductor package device further includes an encapsulant layer encapsulating the first die and the first adhesive layer, and a first conductive via disposed in the first adhesive layer and electrically connected to the first die.

In one or more embodiments, according to another aspect of the present disclosure, a semiconductor package device includes a power device including a first conductive pad, an adhesive layer disposed on the power device, and a package body encapsulating the power device and the adhesive layer. The semiconductor package device further includes a first conductive post disposed in the adhesive layer and contacting the first conductive pad, and a seed layer disposed between the first conductive pad and the first conductive post.

In one or more embodiments, according to another aspect of the present disclosure, a method of manufacturing a semiconductor package device includes providing a carrier having a first conductive layer thereon, forming an adhesive layer on the first conductive layer, and attaching a first side of a die to the adhesive layer, the die comprising at least one conductive pad at the first side. The method further includes encapsulating the die and the adhesive layer with an encapsulant layer, removing the carrier, removing a portion of the first conductive layer to expose a portion of the adhesive layer, removing the exposed portion of the adhesive layer to form a first opening in the adhesive layer, and filling the first opening with a conductive material to form a first conductive via.

BRIEF DESCRIPTION OF THE DRAWINGS

Aspects of the present disclosure are best understood from the following detailed description when read with the accompanying Figures. Various features may not be drawn to scale, and the dimensions of the depicted features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1:
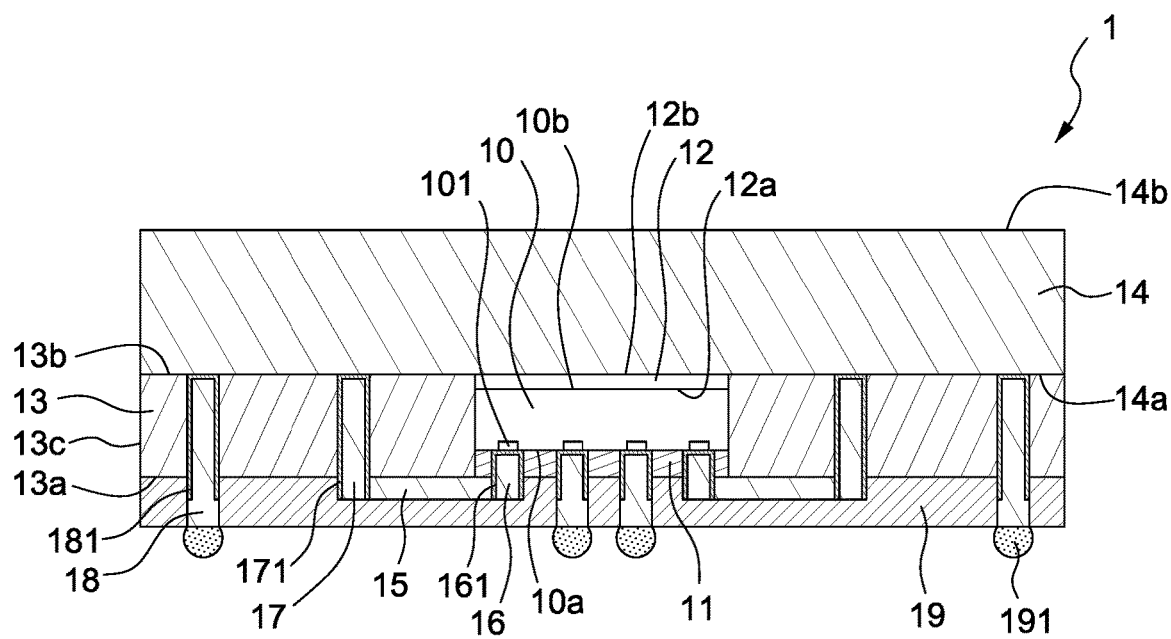
FIG. 1 illustrates a cross-sectional view of some embodiments of a semiconductor package device in accordance with a first aspect of the present disclosure.

FIG. 1 illustrates a cross-sectional view of some embodiments of a semiconductor package device 1 in accordance with a first aspect of the present disclosure. The semiconductor package device 1 includes a die 10, an adhesive layer 11, a conductive layer 12, an encapsulant layer 13, a conductive layer 14, a patterned conductive layer 15, a conductive interconnect 16, a conductive interconnect 17, a conductive interconnect 18, and a mask layer 19.

The die 10 has a surface 10a and another surface 10b opposite to the surface 10a. In some embodiments, the surface 10a may be referred to as a front side, and the surface 10b may be referred to as a back side; however, this description is merely for convenience and is not intended to limit any aspects of the surfaces 10a, 10b. The die 10 may include semiconductor materials, such as silicon (Si) and group III-V materials (e.g. materials including elements of the periodic table groups III and V), and may be doped with other suitable materials. The die 10 may include a semiconductor substrate, one or more integrated circuit devices and one or more overlying interconnection structures. The integrated circuit devices may include active devices such as transistors and/or passive devices such resistors, capacitors, inductors, or a combination thereof. In some embodiments, the die 10 may be a power device, such as a power transistor, a power diode or an IGBT (Insulated Gate Bipolar Transistor). The power device may consume more electric current or power and thus dissipate more thermal energy than non-power devices (such as logic components and/or controllers).

The die 10 may include an electrode 101 disposed on or at the surface 10a. The electrode 101 may provide for external electrical communication with the die 10. In some embodiments, the electrode 101 may include conductive contacts or pads. In some embodiments, more than one electrode 101 may be disposed on or at the surface 10a. In some embodiments, at least one additional electrode may be disposed on or at the surface 10b. The at least one additional electrode may have a substantially same size as, or a different size than, the electrode 101.

The adhesive layer 11 is disposed on the surface 10a of the die 10 and may serve to attach the die 10 to other parts or components of the semiconductor package device 1 (e.g., to the patterned conductive layer 15). In some embodiments, the adhesive layer 11 may include a gel type or film type adhesive layer. The adhesive layer 11 may include a thermoset resin. The adhesive layer 11 may include a thermoplastic resin. The adhesive layer 11 may include one or more of the following: a resin, a polyester resin, a polyether resin, an epoxy resin and/or a polyolefin composition. The adhesive layer 11 may be thicker or thinner than the die 10, or may be substantially as thick as the die 10. The adhesive layer 11 may be disposed along a perimeter of the die 10. The adhesive layer 11 may define one or more openings, which may expose the electrode 101. In some embodiments, the adhesive layer 11 may include a die attach layer. In some embodiments, the adhesive layer 11 is insulative.

The conductive layer 12 is disposed on the surface 10b of the die 10. The conductive layer 12 is optional. The conductive layer 12 may be omitted in accordance with some embodiments of the present disclosure. The conductive layer 12 has a surface 12a and a surface 12b opposite to the surface 12a. A portion of the surface 10b of the die 10 may be in contact with the surface 12a of the conductive layer 12, or substantially the entirety of the surface 10b of the die 10 may be in contact with the surface 12a of the conductive layer 12. In some embodiments, the conductive layer 12 may be a backside metal layer. In some embodiments, the conductive layer 12 provide for improved thermal and/or electrical transmission characteristics, as compared to, for example, solder bonding or transient phase liquid bonding (TLP), each of which includes higher electrical and thermal resistance. In some embodiments, the conductive layer 12 may operate as a heat slug or heat sink or heat spreader. Certain methods of providing the conductive layer 12, such as plating, provide for reduced thermal stresses during manufacture because, for example, a plating technique may be implemented at moderate temperature (e.g., at less than about 50 degrees Celsius (° C.), such as at less than about 45° C., at less than about 40° C., or lower) as opposed techniques that may be implemented at higher temperature, such as soldering (which can be implemented at temperatures greater than about 170° C., such as greater than about 180° C., greater than about 190° C., greater than about 200° C., or greater) or TLP (which can be implemented at least up to about 450° C.). Further, solder or TLP reflow can cause the die 10 to shift and thereby lead to misalignment of the die 10 with other components of the semiconductor package device 1. Improved electrical transmission characteristics, such a lower electrical resistance, of the conductive layer 12 can be beneficial, such as in implementations where the conductive layer 12 is connected in a power or ground path, or in a high current path. In some embodiments, the conductive layer 12 covers substantially the entire surface 10b of the die 10.

The encapsulant layer 13 has a surface 13a, a surface 13b and a lateral surface 13c extending between the surfaces 13a, 13b. In some embodiments, the encapsulant layer 13 may include, but is not limited to, an epoxy resin having fillers, a molding compound (e.g., an epoxy molding compound or other molding compound), a polyimide, a phenolic compound or material, a material with a silicone dispersed therein, or a combination thereof. In some embodiments, the encapsulant layer 13 is a package body.

The encapsulant layer 13 may encapsulate the die 10, the adhesive layer 11, and the optional conductive layer 12. A portion of the surface 10b of the die 10 may be exposed from the encapsulant layer 13, or substantially an entirety of the surface 10b of the die 10 may be exposed from the encapsulant layer 13. For example, substantially an entirety of the surface 10b of the die 10 may be exposed from the encapsulant layer 13 such that at least 90% of the surface 10b is exposed from the encapsulant layer 13 (e.g., at least about 92%, at least about 95%, at least about 98%, or more of the surface 10b is exposed). Such exposure allows the surface 10b of the die 10 to be in direct contact with other parts or components of the semiconductor package device 1, and this direct contact may facilitate thermal communication between the die 10 and the other parts or components of the semiconductor package device 1 that have a desirable thermal characteristic (such as a high heat conduction rate (e.g. a higher heat conduction rate than that of the encapsulant layer 13)). In some embodiments, the more the surface 10b is in contact with the other parts, the more facilitated is the thermal communication therebetween.

In some embodiments, the surface 13b may be substantially coplanar with the surface 10b of the die 10. The surface 13b may be substantially coplanar with the surface 12b of the conductive layer 12 (e.g. in embodiments in which the conductive layer 12 is included in the semiconductor package device 1). In some embodiments, one or more surfaces of the adhesive layer 11 may be recessed from the surface 13a. In some embodiments, the surface 10b and/or the surface 12b of the conductive layer 12 may be recessed from the surface 13b.

The conductive layer 14 is disposed over the encapsulant layer 13 and the die 10, and may be sputtered or seeded, such as by titanium-copper or electroless copper (Cu) seeding. The conductive layer 14 may be plated to a target thickness (e.g., to about 25 µm, to about 50 µm, to about 75 µm, or to another suitable target thickness). In some embodiments, the conductive layer 14 may include Cu. In some embodiments, the conductive layer 12 is omitted, and the conductive layer 14 provides for thermal communication to the die 10 (e.g. provides for better thermal communication than does the encapsulant layer 13). In some embodiments, the conductive layer 14 helps dissipate heat generated by the die 10 at a higher rate than would the encapsulant layer 13, if the encapsulant layer 13 is disposed above the die 10). The conductive layer 14 may function as a heat sink. In embodiments in which the conductive layer 12 is omitted and the surface 10b of the die 10 is in direct contact with the conductive layer 14, the rate at which heat may transfer between the die 10 and the conductive layer 14 is positively correlated with the area and/or amount of direct contact between the surface 10b of the die 10 and the conductive layer 14. In some embodiments, the conductive layer 14 covers substantially the entire surface 10b. In some embodiments, a side surface of the conductive layer 14 is substantially coplanar with the lateral surface 13c of the encapsulant layer 13. In some embodiments, the conductive layer 14 substantially covers an entire top surface of the encapsulant layer 13.

The patterned conductive layer 15 is disposed on the encapsulant layer 13 and/or the adhesive layer 11. The patterned conductive layer 15 may include a metal, such as copper, aluminum, silver or gold. The patterned conductive layer 15 may serve to electrically connect different parts or components of the semiconductor package device 1, such as the conductive interconnect 16 and the conductive interconnect 17. In some embodiments, part or substantially all of the patterned conductive layer 15 may constitute traces on the semiconductor package device 1.

At least one conductive interconnect 16 may be disposed in the adhesive layer 11 and provide for electrical and/or thermal communication to the electrode 101 exposed from the adhesive layer 11. In some embodiments, the conductive interconnect 16 may include a conductive via or a conductive post. The conductive interconnect 16 may include a metal, such as copper, aluminum, silver or gold, metal alloys, or any suitable materials. The materials of the conductive interconnect 16 may be substantially the same as or different from the patterned conductive layer 15. In some embodiments, the conductive interconnect 16 may protrude from the adhesive layer 11.

A seed layer 161 is formed or disposed between the exposed electrode 101 of the die 10 and the conductive interconnect 16. The seed layer 161 may be disposed between the adhesive layer 11 and the conductive interconnect 16. In some embodiments, the seed layer 161 may be disposed between a portion of the conductive interconnect 16 and a portion of the patterned conductive layer 15 (as indicated in FIG. 1). In some embodiments, the conductive interconnect 16 is surrounded by the seed layer 161. The seed layer 161 may be omitted in accordance with some embodiments of the present disclosure. The seed layer 161 may include a metal, such as copper, aluminum, silver or gold, and may include any materials that facilitate the manufacture of the conductive interconnect 16. In some embodiments, the patterned conductive layer 15, the conductive interconnect 16 and/or the seed layer 161 may include a substantially same material, and a boundary between the layers of the substantially same material may not be readily apparent.

At least one conductive interconnect 17 may be disposed in the encapsulant layer 13 and provide for electrical and/or thermal communication to and from the conductive layer 14 through the encapsulant layer 13. In some embodiments, the conductive interconnect 17 may include a conductive via or a conductive post. The conductive interconnect 17 may include a metal, such as copper, aluminum, silver or gold, or metal alloys, or any suitable materials. The materials of the conductive interconnect 17 may be substantially the same as, or different from, the conductive interconnect 16. In some embodiments, the conductive interconnect 16 may protrude from the encapsulant layer 13. In some embodiments, the conductive interconnect 17 may be electrically connected to other parts of the semiconductor package device 1, such as the conductive interconnect 16, by the patterned conductive layer 15.

A seed layer 171 is formed or disposed between the conductive interconnect 17 and the encapsulant layer 13. In some embodiments, the seed layer 171 may be disposed between a portion of the conductive interconnect 17 and a portion of the patterned conductive layer 15 (as indicated in FIG. 1). The seed layer 171 may be omitted in accordance with some embodiments of the present disclosure. The seed layer 171 may include a metal, such as copper, aluminum, silver or gold, and may include any materials that facilitate the manufacture of the conductive interconnect 17. In some embodiments, the patterned conductive layer 15, the conductive interconnect 17 and/or the seed layer 171 may include substantially the same material, in which case, a boundary between the layers of the same material may not be readily discernable.

At least one conductive interconnect 18 may be disposed in the encapsulant layer 13 and provide for electrical and/or thermal communication to and from the conductive layer 14 through the encapsulant layer 13. In some embodiments, the conductive interconnect 18 may include a conductive via or a conductive post. The materials of the conductive interconnect 18 may be similar to, or substantially the same as, the conductive interconnect 16 and/or the conductive interconnect 17.

A seed layer 181 is formed or disposed between the conductive interconnect 18 and the encapsulant layer 13. The seed layer 181 may be omitted in accordance with some embodiments of the present disclosure. The materials of the seed layer 181 may be similar to, or substantially the same as, those of the seed layers 161 and/or 171.

The mask layer 19 is disposed on the surface 13a of the encapsulant layer 13. One or more of the conductive interconnects 16, 17 and 18 may be exposed from the mask layer 19 to provide electrical and/or thermal communication. In some embodiments, a connection element 191 (such as a solder ball or conductive pad or conductive interconnect) may be provided on the exposed conductive interconnects 16, 17 and 18 to provide electrical and/or thermal communication with components external to the semiconductor package device 1. In some embodiments, the mask layer 19 includes a solder mask layer, or a solder resist layer. In some embodiments, the mask layer 19 surrounds at least a portion of the conductive interconnects 16, 17 and 18.

An optional seed layer may be disposed between the encapsulant layer 13 and the conductive layer 14 so as to facilitate the manufacture of the conductive layer 14. In some embodiments, the seed layer is conductive and may include Cu or titanium-copper (TiCu). The conductive layer 14 and the optional seed layer may include substantially the same materials, or different materials.

Figure 2A:
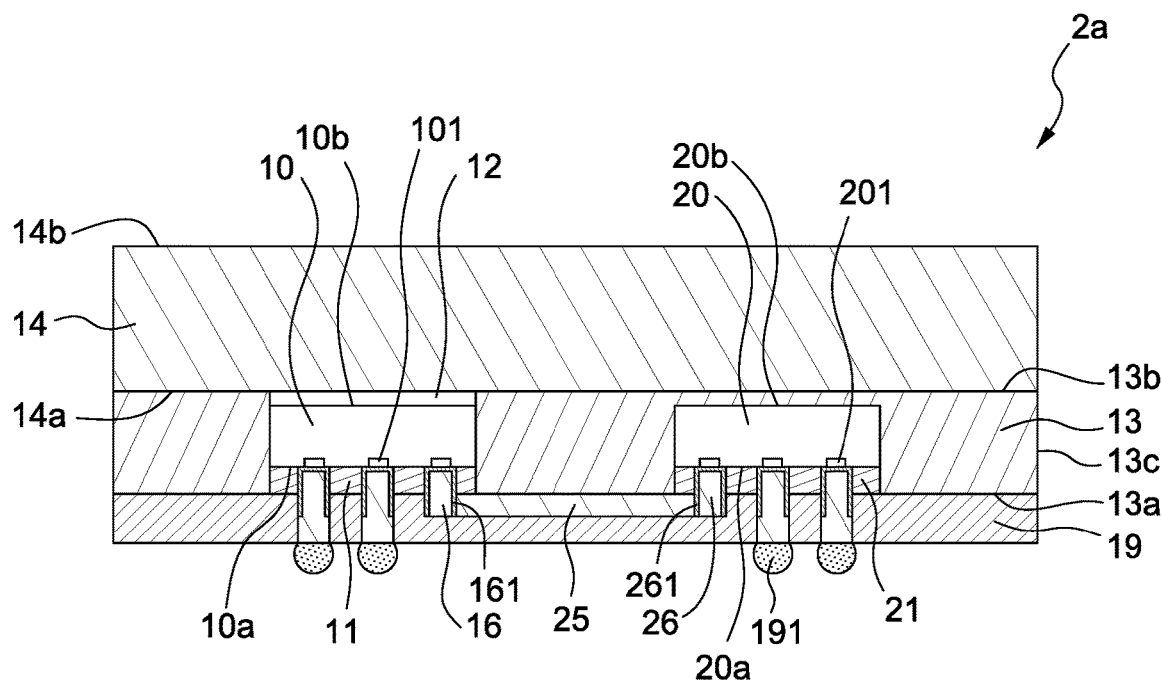
FIG. 2A, FIG. 2B, FIG. 2C illustrate a cross-sectional view of some embodiments of semiconductor package devices in accordance with a second aspect of the present disclosure.

FIG. 2A illustrates a cross-sectional view of some embodiments of a semiconductor package device 2a in accordance with a second aspect of the present disclosure. The semiconductor package device 2a includes a die 10, an adhesive layer 11, a conductive layer 12, an encapsulant layer 13, a conductive layer 14, a patterned conductive layer 25, a conductive interconnect 16, a conductive interconnect 17, a conductive interconnect 18, a mask layer 19, a die 20, an adhesive layer 21, and a conductive interconnect 26. Although FIG. 2A depicts two dies (die 10 and die 20), the semiconductor package device 2a may include more than two dies, such as three, four, five, six, seven or more dies.

The die 20 has a surface 20a and another surface 20b opposite to the surface 20a. In some embodiments, the surface 20a may be referred to as a front side, and the surface 20b may be referred to as a back side; however, this description is merely for convenience and is not intended to limit any aspects of the surfaces 20a, 20b. The die 20 may include semiconductor materials, such as Si and group III-V materials, and may be doped with other materials of interest. The die 20 may include a semiconductor substrate, one or more integrated circuit devices and one or more overlying interconnection structures. The integrated circuit devices may include active devices such as transistors and/or passive devices such resistors, capacitors, inductors, or a combination thereof. In some embodiments, the die 20 may include a non-power device, such as a logic component and/or controller, and the non-power device may consume less electric current and/or power and thus dissipate less thermal energy than power devices (such as a power transistor, a power diode or an IGBT).

The die 20 may include an electrode 201 disposed on or at the surface 20a. The electrode 201 may provide for external electrical communication with the die 20. In some embodiments, the electrode 201 may include a contact or pad. In some embodiments, more than one electrode 201 may be disposed on or at the surface 20a. At least a portion of the electrode 201 (e.g. a bottom surface of the electrode 201) may be exposed from the adhesive layer 21.

At least one conductive interconnect 26 may be disposed in the adhesive layer 21 and provide for electrical and/or thermal communication to the electrode 201 exposed from the adhesive layer 21. In some embodiments, the conductive interconnect 26 may include a conductive via or a conductive post. The conductive interconnect 26 may include a metal, such as copper, aluminum, silver or gold, or metal alloys, or any suitable materials. The materials of the conductive interconnect 26 may be substantially the same as, or different from, the conductive interconnect 16. In some embodiments, the conductive interconnect 26 may protrude from the adhesive layer 21.

An optional seed layer 261 may be formed or disposed between the exposed electrode 201 and the conductive interconnect 26. The structural, positional and material aspects of the seed layer 261 may be similar to or substantially the same as those of the seed layer 161.

The patterned conductive layer 25 is disposed on the encapsulant layer 13 and/or the adhesive layers 11, 21. The patterned conductive layer 25 may include a metal, such as copper, aluminum, silver or gold. The patterned conductive layer 25 may serve to electrically connect different parts and/or components of the semiconductor package device 1. In the example shown in FIG. 2A, the patterned conductive layer 25 electrically connects the conductive interconnects 16 and 26. In some embodiments, a portion of, or substantially all of, the patterned conductive layer 25 may constitute one or more traces disposed on the semiconductor package device 2a.

Figure 2B:
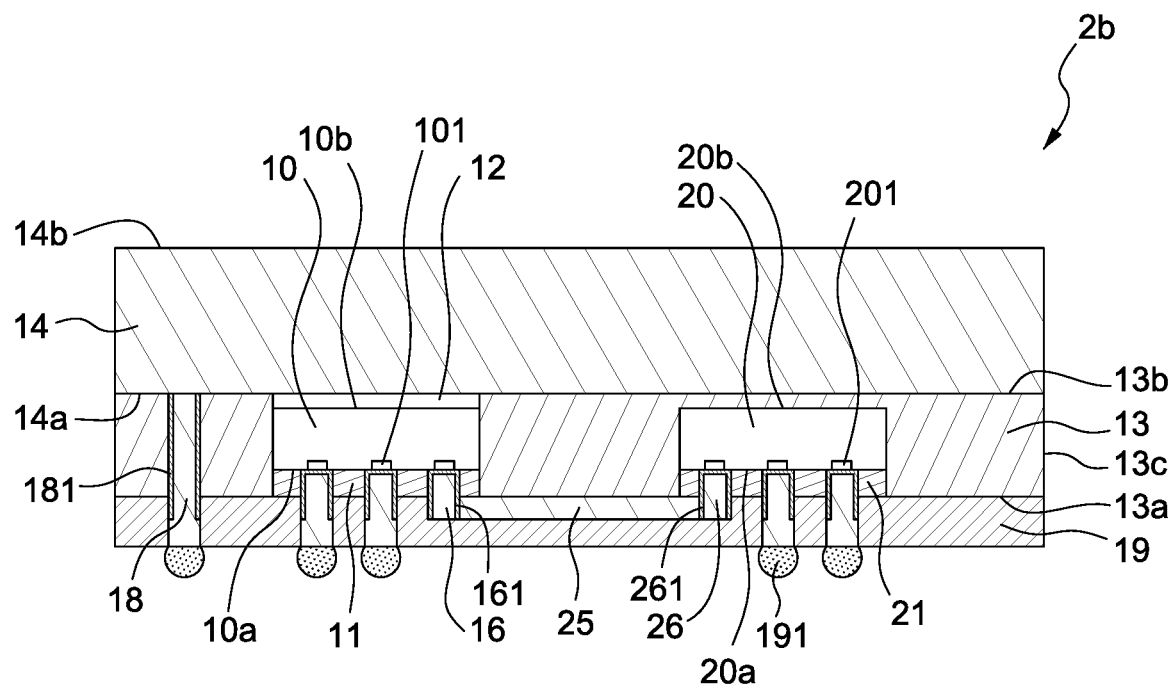

FIG. 2B illustrates a cross-sectional view of some embodiments of a semiconductor package device 2b in accordance with the second aspect of the present disclosure.

The semiconductor package device 2b differs from the semiconductor package device 2a by additionally including a conductive interconnect 18, which provides for electrical and/or thermal communication to and from the conductive layer 14 through the encapsulant layer 13. An optional seed layer 181 may be provided.

Figure 2C:
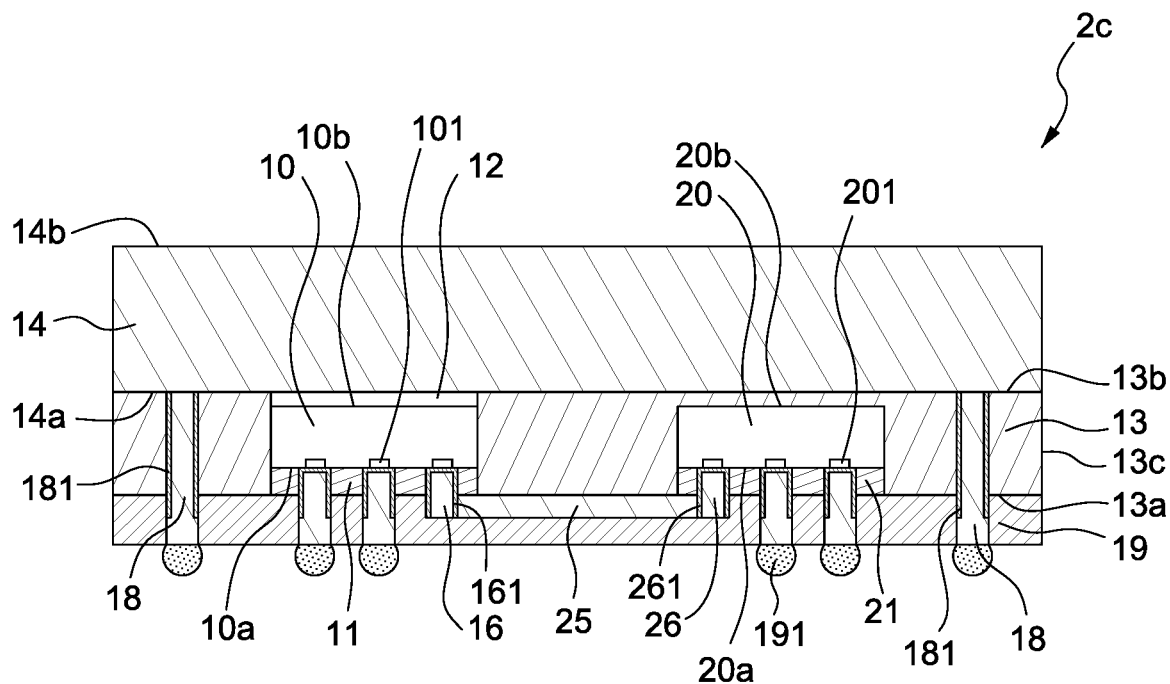

FIG. 2C illustrates a cross-sectional view of some embodiments of a semiconductor package device 2c in accordance with the second aspect of the present disclosure. The semiconductor package device 2c includes yet another conductive interconnect 18, which may be surrounded by the optional seed layer 181.

FIG. 3A, FIG. 3B, FIG. 3C, FIG. 3D, FIG. 3E, FIG. 3F, FIG. 3G, FIG. 3H, FIG. 3I, FIG. 3J and FIG. 3K illustrate a method of manufacturing a semiconductor package device in accordance with some embodiments of the present disclosure.

Figure 3A:
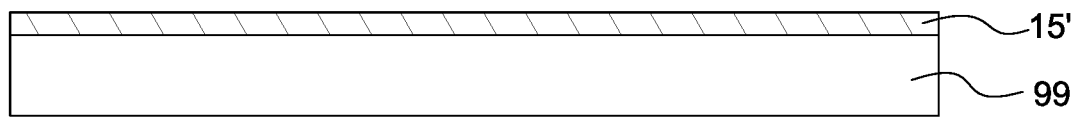
FIG. 3A, FIG. 3B, FIG. 3C, FIG. 3D, FIG. 3E, FIG. 3F, FIG. 3G, FIG. 3H, FIG. 3I, FIG. 3J and FIG. 3K illustrate a method of manufacturing a semiconductor package device in accordance with some embodiments of the present disclosure.

Referring to FIG. 3A, a carrier 99 is provided, and a conductive layer 15' is disposed on the carrier 99. The carrier 99 may be a laminate, a layer, or a stack such as copper/aluminum/copper stack or a copper/nickel/iron alloy/copper stack. A stack may be peelable or otherwise removeable. The carrier 99 may have a low coefficient of thermal expansion (CTE). The conductive layer 15' may include any conductive material, such as aluminum, copper, silver, or gold; metal alloys thereof; or any appropriate material. The conductive layer 15' may be, for example, plated or sputtered.

Figure 3B:
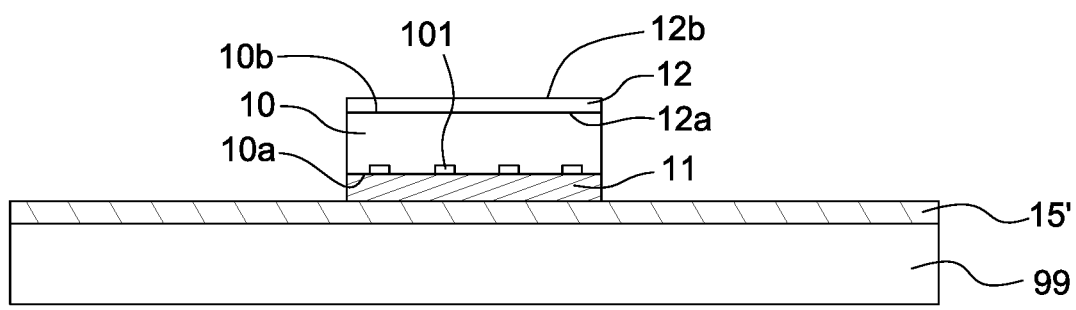

Referring to FIG. 3B, the die 10 and the (optional) conductive layer 12 are attached to the carrier 99 by the adhesive layer 11. In some embodiments, the adhesive layer 11 is disposed on the conductive layer 15' or the carrier 99, and then the die 10 and the conductive layer 12 are disposed on the adhesive layer 11. In some embodiments, the die 10 is disposed on the adhesive layer 11, and then the conductive layer 12 is disposed on the die 10. Other permutations of this process may additionally or alternatively be performed. In some embodiments, the conductive layer 12 may be a backside metal layer and may include any suitable metal, alloy, or combination thereof, such as nickel-silver or copper-nickel. The conductive layer 12 may be disposed by electroplating, sputtering, or other suitable techniques, or may be disposed on the die 10 as a sheet or film of metal.

The die 10 has a surface 10a and a surface 10b, and at least one electrode 101 is provided on or at the surface 10a. Although FIG. 3B illustrates that the die 10, the adhesive layer 11, the conductive layer 12 and the conductive layer 15' are disposed on a first side of the carrier 99, any one of them may be disposed on a second side of the carrier 99 opposite to the first side, or on both sides of the carrier 99, using similar or different techniques.

Figure 3C:
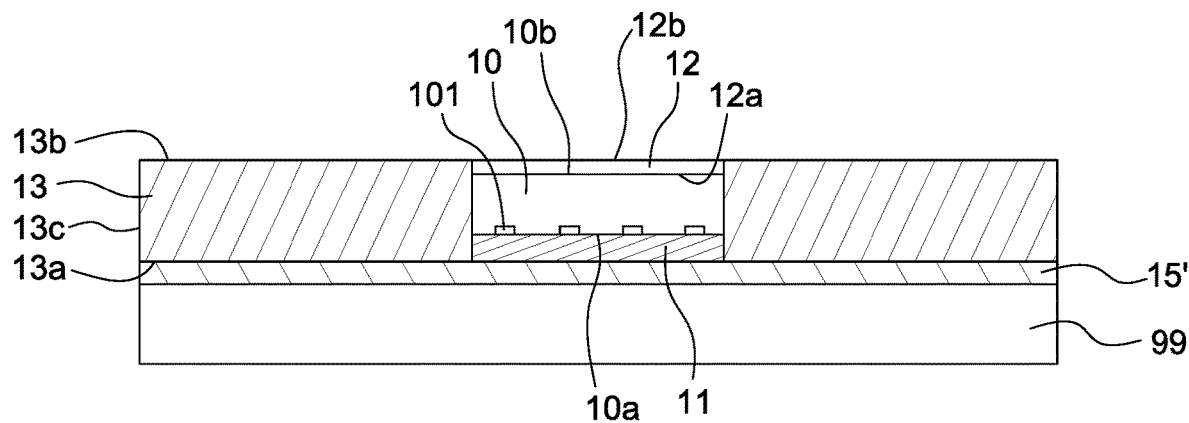

Referring to FIG. 3C, an encapsulant layer 13 having a surface 13a, a surface 13b and a lateral surface 13c is provided to encapsulate the die 10, the adhesive layer 11 and the conductive layer 12. As indicated in FIG. 3C, the conductive layer 12 (or the surface 10b if the conductive layer 12 is not to be included in the semiconductor package device) is at least partially exposed from the encapsulant layer 13. In some embodiments, substantially an entirety of the surface 10b is exposed from the encapsulant layer 13 (e.g., at least about 92%, at least about 95%, at least about 98%, or more of the surface 10b is exposed from the encapsulant layer 13). In some embodiments, the surface 13b may be substantially coplanar with the surface 12b of the conductive layer 12 or the surface 10b of the die 10. In some embodiments, the conductive layer 12 may be recessed below the surface 13b. The die 10 is encapsulated by the encapsulant layer 13 (e.g., in a molding compound), and in some embodiments lamination of other protective films (such as Pre-preg films) may be omitted.

A comparative die attach operation may involve a relatively high temperature to cure the adhesive layer 11. Since in the depicted process the die 10 is encapsulated after having been attached, the encapsulant layer 13 is not directly subjected to the relatively high temperature that may be used to cure the adhesive layer 11 and thus may not be subjected to a temperature higher than the Glass Transition Temperature (Tg) of the material of the encapsulant layer 13. Thus the encapsulant layer 13 may not soften and may firmly hold the encapsulated die 10 in subsequent manufacturing processes, thereby helping to prevent shifting of the die 10 and improving its alignment with other parts of the semiconductor package device, and its registration.

Figure 3D:
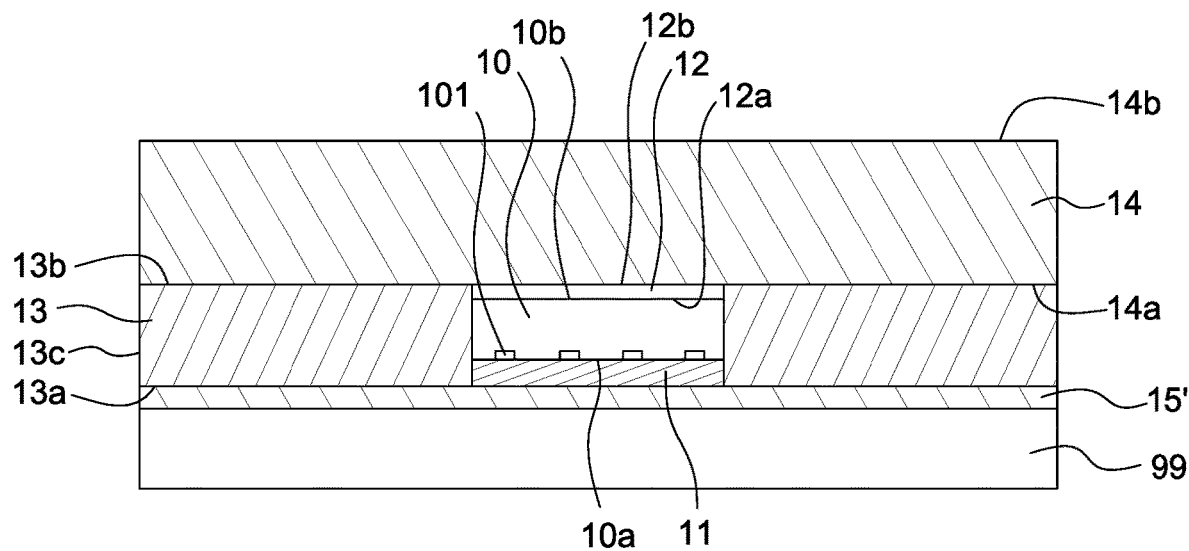

Referring to FIG. 3D, a conductive layer 14 is formed on the encapsulant layer 13 by any suitable techniques, such as electro-plating or electroless-plating (which may be facilitated by an optional pre-formed seed layer), sputtering and lamination. The conductive layer 14 has a surface 14a and a surface 14b opposite to the first surface 14a.

Figure 3E:
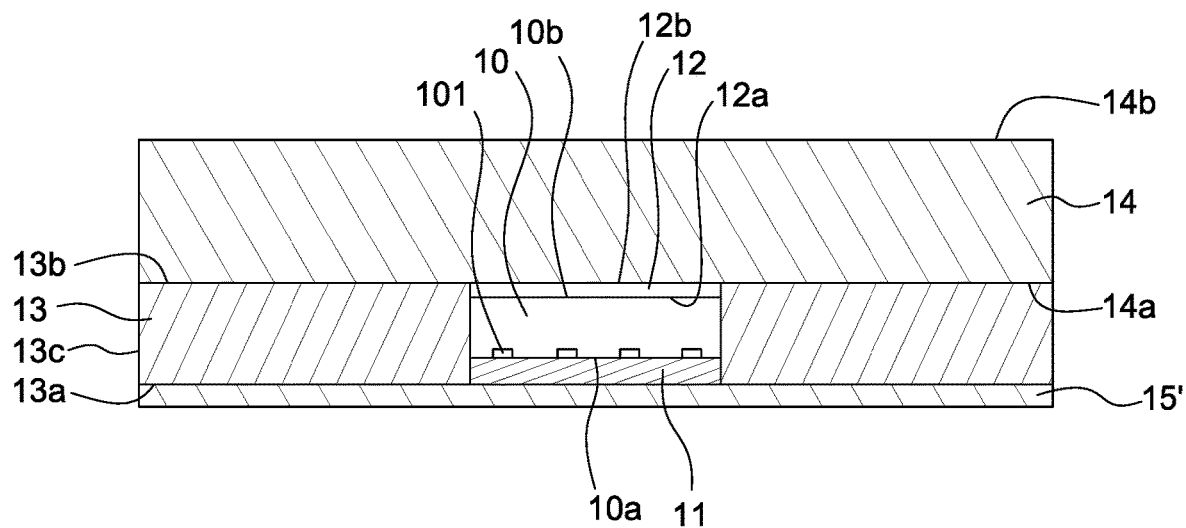

Referring to FIG. 3E, the carrier 99 is removed, which may expose at least a portion of the conductive layer 15'.

Figure 3F:
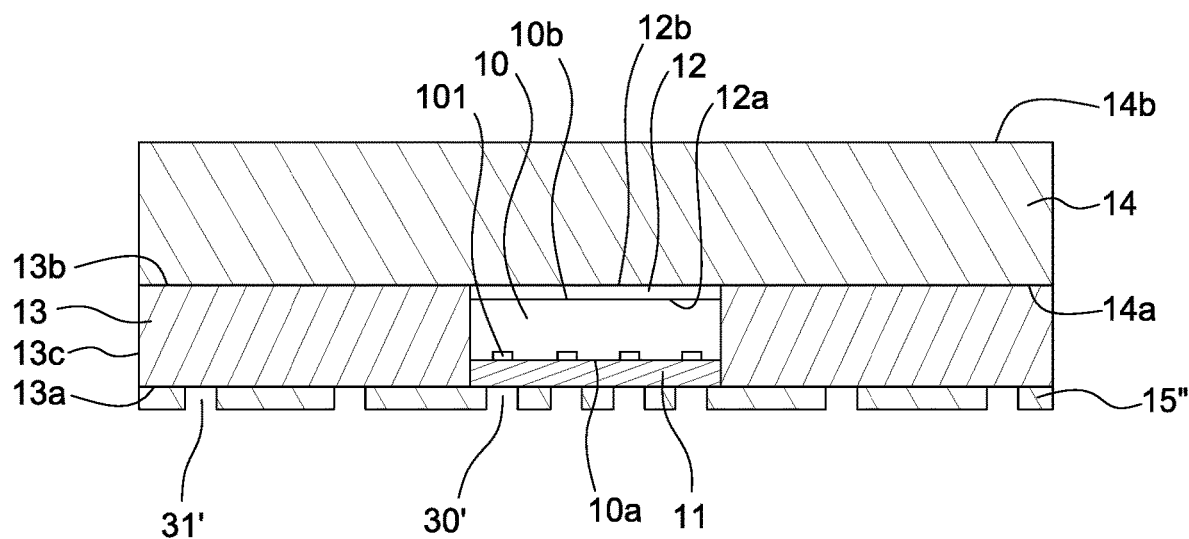

Referring to FIG. 3F, at least one opening 30' that corresponds to the electrode 101 (e.g. that exposes a portion of the adhesive layer 11) may be formed by removing a portion of the conductive layer 15'. At least one opening 31' may be formed in a similar manner. The conductive layer 15' becomes patterned after this process, and is herein referred to as a conductive layer 15" after the formation of the openings 30' and 31'. The openings 30' and 31' may be formed by, for example, photolithography techniques, laser ablation, etching, laser drilling and/or mechanical drilling.

Figure 3G:
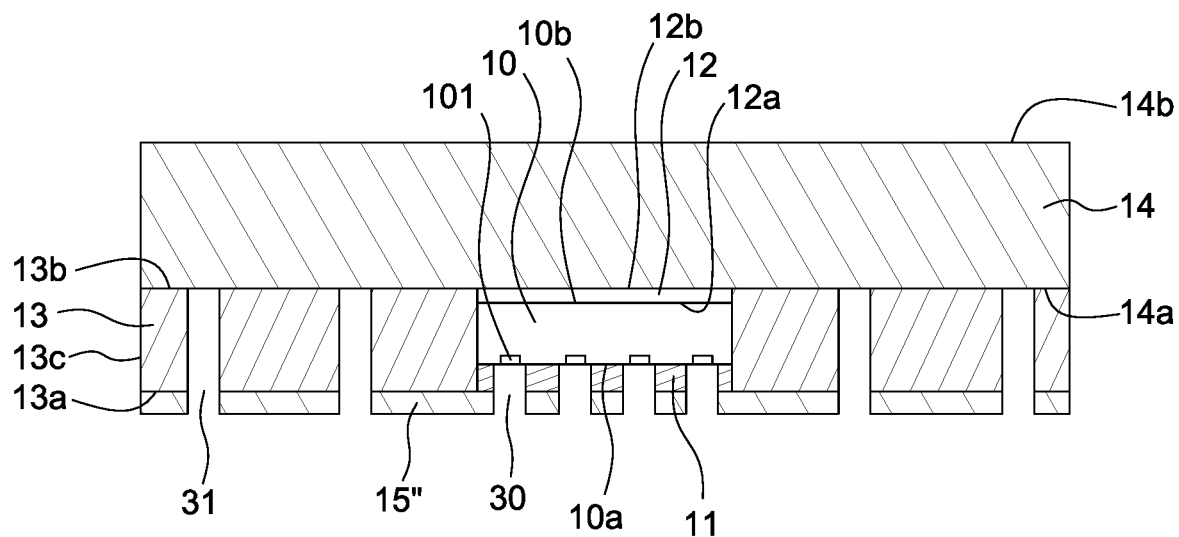

Refer to FIG. 3G, at least one opening 30 that exposes the electrode 101 may be formed by removing a portion of the adhesive layer 11 (e.g. a portion of the adhesive layer 11 exposed by the opening 30'). At least one opening 31 may be formed by removing a portion of the encapsulant layer 13 (e.g. a portion of the encapsulant layer 13 exposed by the opening 31'). In implementations in which the material of the conductive layer 15' is different from that of the adhesive layer 11 and the encapsulant layer 13, it may be advantageous to employ different techniques to remove portions of different layers for the formation of the openings 30 and 30' and the openings 31 and 31'.

The opening 30 is formed to expose the electrode 101 after the die 10 has been attached and/or secured. In this way, the location at which the electrode 101 is exposed may be better controlled, thereby improving the alignment and registration of the die 10.

Figure 3H:
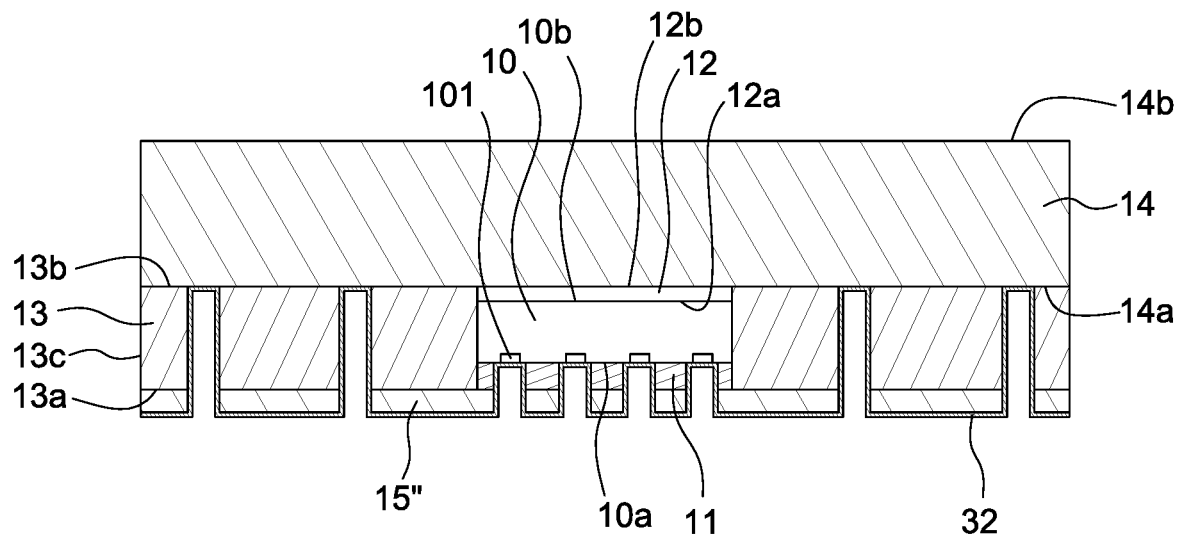

Referring to FIG. 3H, a seed layer 32 may be formed in any number of the openings 30 and 31. In some embodiments, the seed layer 32 is formed in all of the openings 30 and 31, as indicated in FIG. 3H. The seed layer 32 is conductive and may facilitate subsequent manufacturing processes, such as the formation of conductive materials thereon. As indicated in FIG. 3H, the seed layer 32 may be formed on sidewalls of the openings 30 and 31 (e.g. on portions of the adhesive layer 11 and the encapsulant layer 13) and/or the patterned conductive layer 15", and/or formed on the exposed electrode 101.

Figure 3I:
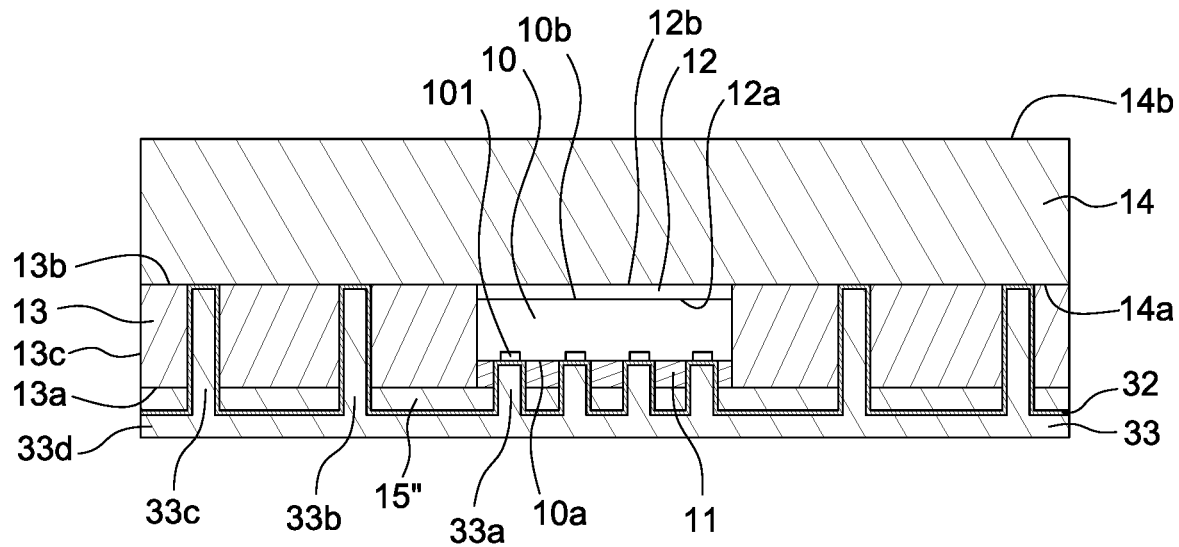

Referring to FIG. 3I, a conductive layer 33 may be formed by any suitable techniques, such as electro-plating, electroless-plating, sputtering, filling, and combinations thereof, and may fill at least a portion of the openings 30, 31. In some embodiments, the openings 30 and 31 are formed before the conductive layer 14 is formed, and the formation of the conductive layer 14 and the conductive layer 33 are performed in a single operation (e.g., double-sided plating and/or sputtering).

The conductive layer 33 may include different portions such as a portion 33a, a portion 33b, a portion 33c and a portion 33d. The portion 33a is disposed in the adhesive layer 11 and may protrude therefrom. The portions 33b, 33c are disposed in the encapsulant layer 13 and may protrude therefrom. The portion 33d is formed on the patterned conductive layer 15" and/or the seed layer 32. In implementations in which the materials of the patterned conductive layer 15", the seed layer 32 and any of the portions 33a, 33b, 33c, 33d are substantially similar, a border between those portions and/or layers may not be readily discernable.

Figure 3J:
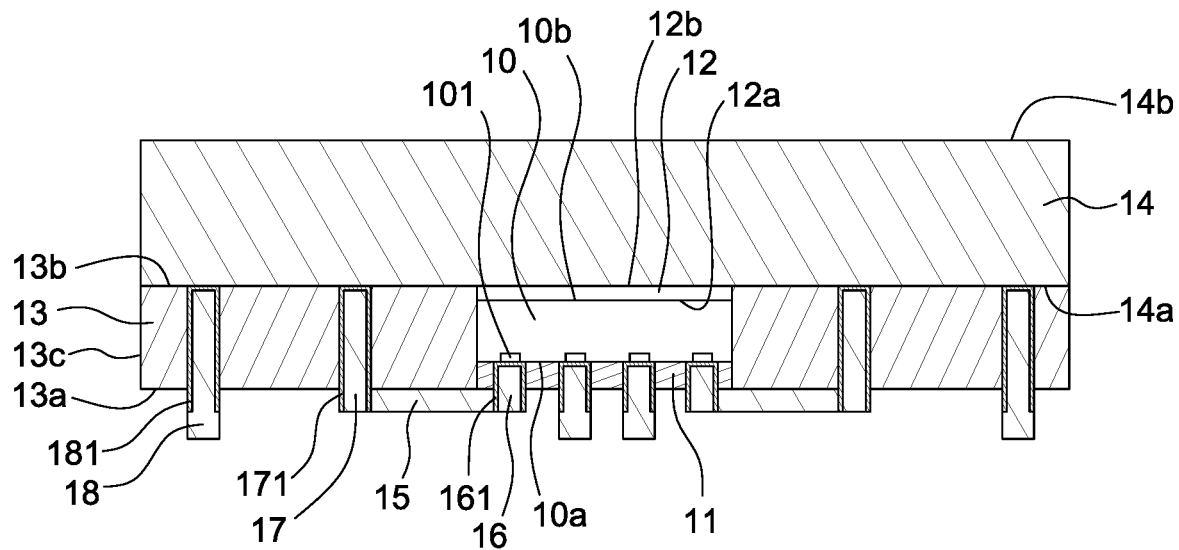

Referring to FIG. 3J, a portion of the conductive layer 33 is removed to form a patterned conductive layer 15, a conductive interconnect 16, a conductive interconnect 17 and a conductive interconnect 18. The removal may be performed by any suitable process, such as photolithography, drilling, laser ablation, and etching (including tent etch stripping and strip flash etching). In some embodiments, the removal of the portion of the conductive layer 33 constitutes patterning of the conductive layer 33. A portion of the seed layer 32 may be removed (e.g. the seed layer 32 may be patterned) to form the seed layers 161, 171, 181.

Figure 3K:
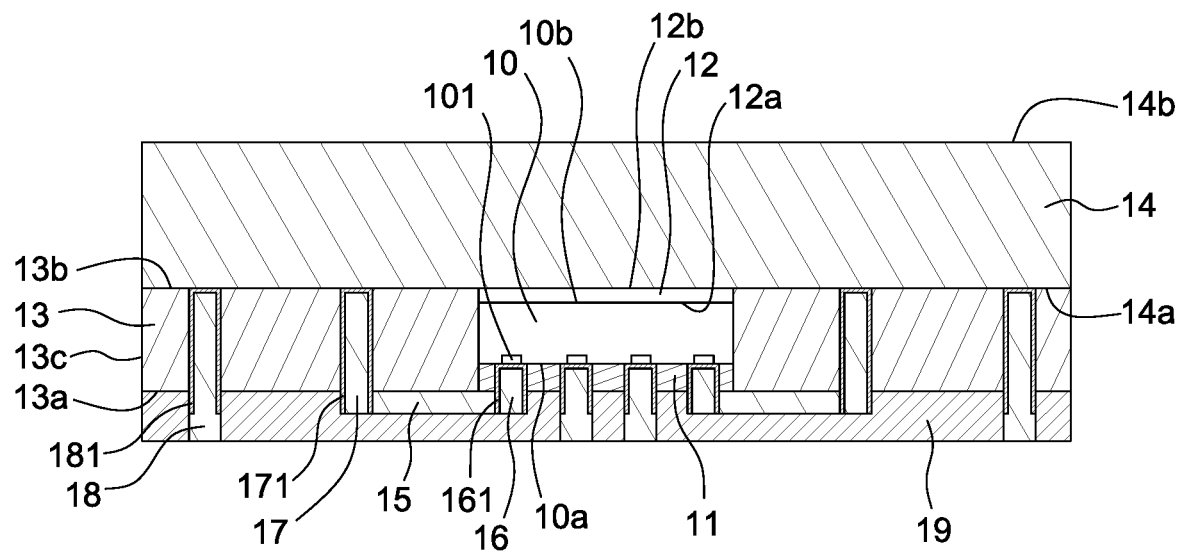

Referring to FIG. 3K, a mask layer 19 is applied to encapsulate or cover the patterned conductive layer 15, the conductive interconnect 16, the conductive interconnect 17 and the conductive interconnect 18. In some embodiments, the conductive interconnect 18 is exposed from the mask layer 19.

Afterwards, a connection element 191 may be disposed on the exposed conductive interconnect 18 to arrive at a semiconductor package device according to some embodiments of the present disclosure, such as the semiconductor package device 1 shown in FIG. 1.

The manufacturing processes illustrated in FIG. 3A, FIG. 3B, FIG. 3C, FIG. 3D, FIG. 3E, FIG. 3F, FIG. 3G, FIG. 3H, FIG. 3I, FIG. 3J and FIG. 3K may be adapted to accommodate semiconductor package devices with more than one die, such as the semiconductor package devices 2a, 2b, 2c.

FIG. 4A, FIG. 4B, FIG. 4C and FIG. 4D illustrate a cross-sectional view of some embodiments of semiconductor package devices in accordance with a third aspect of the present disclosure.

Figure 4A:
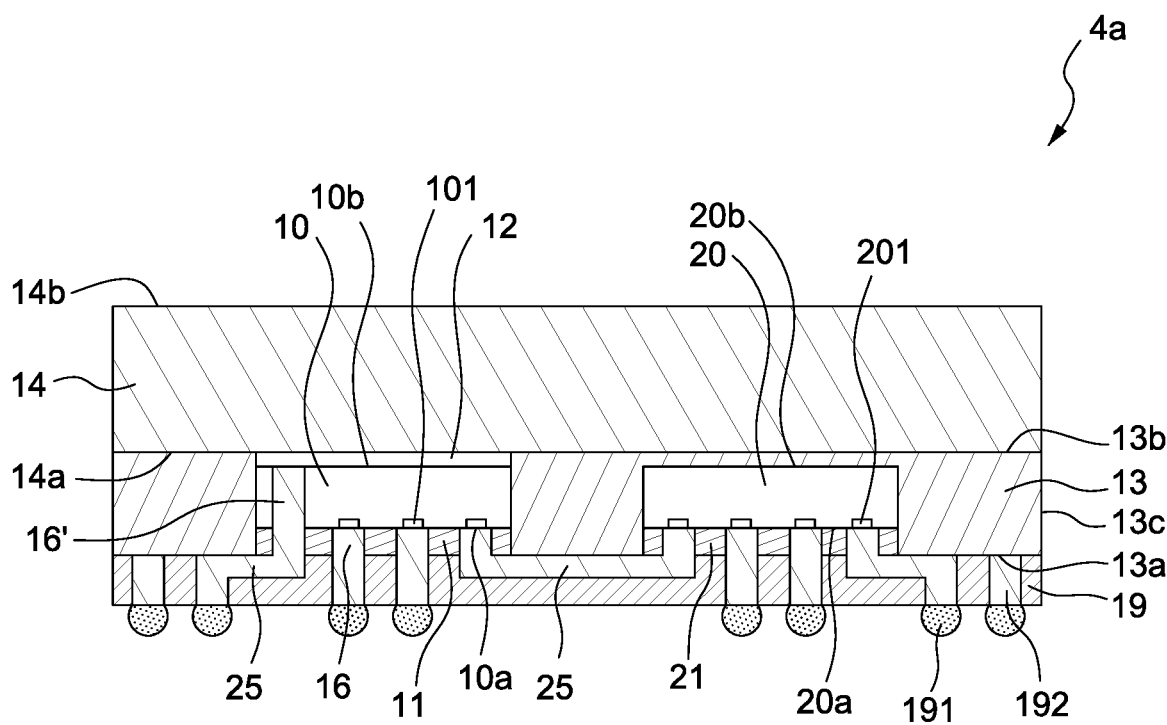
FIG. 4A, FIG. 4B, FIG. 4C and FIG. 4D illustrate a cross-sectional view of some embodiments of semiconductor package devices in accordance with a third aspect of the present disclosure.

Referring to FIG. 4A, a semiconductor package device 4a is shown. The semiconductor package device 4a is similar to the semiconductor package device 2a shown in FIG. 2A. One difference is the inclusion of a conductive interconnect 16', which extends through the adhesive layer 11 and through the die 10 (and contacts the conductive layer 12 in implementations that include the conductive layer 12). In some embodiments, the conductive interconnect 16' is disposed in the die 10. Another difference is the inclusion of the conductive interconnect 192, which traverses the mask layer 19. In some embodiments, the patterned conductive layer 25 may be formed so as to connect the conductive interconnect 192 to other parts of the semiconductor package device 4a, such as to the conductive interconnects 16 and 16'.

Figure 4B:
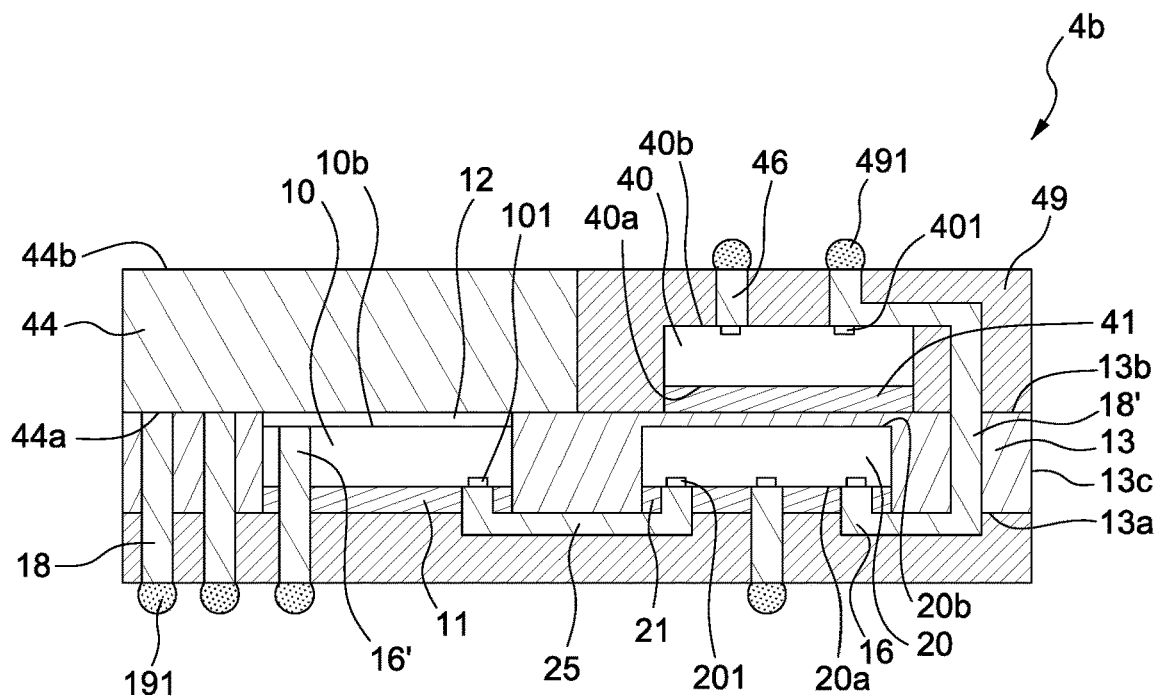

Referring to FIG. 4B, a semiconductor package device 4b is shown. Compared to the embodiments that have been described above, the semiconductor package device 4b further includes a conductive layer 44 that selectively covers a part (and not the entirety) of the surface 13b of the encapsulant layer 13. Another part of the surface 13b is covered by a die 40 and an adhesive layer 41. The semiconductor package device 4b further includes a mask layer 49 that encapsulates the die 40 and the adhesive layer 41.

The die 40 is attached to the encapsulant layer 13 by the adhesive layer 41, and has a surface 40a, a surface 40b opposite to the surface 40a and at least one electrode 401 disposed on or at the surface 40b. At least one conductive interconnect 46 is disposed in the mask layer 49 to provide electrical and/or thermal communication between the electrode 401 and components external to the semiconductor package device 4b, by way of at least one connection element 491. The semiconductor package device 4b includes a conductive interconnect 18' to provide electrical connection between the conductive interconnect 16 and the conductive interconnect 46, and thereby provide electrical connection between the die 40 and the die 20. The conductive interconnect 18' may also be configured to provide electrical connection between the die 40 and the die 10.

Figure 4C:
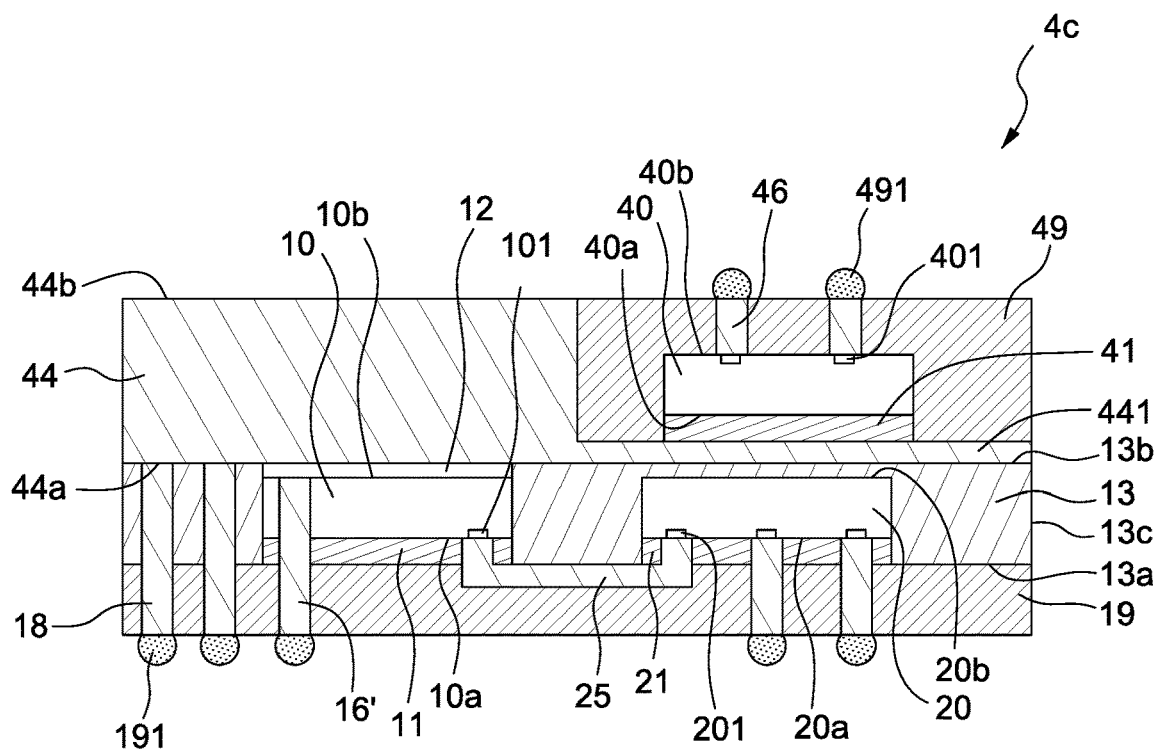

Referring to FIG. 4C, a semiconductor package device 4c is shown. Compared to the semiconductor package device 4b, the conductive layer 44 of the semiconductor package device 4c further includes a portion 441 that is thinner than a main body portion of the conductive layer 44, and that extends under at least a portion of the die 40. The die 40 is attached to the portion 441 by the adhesive layer 41.

Figure 4D:
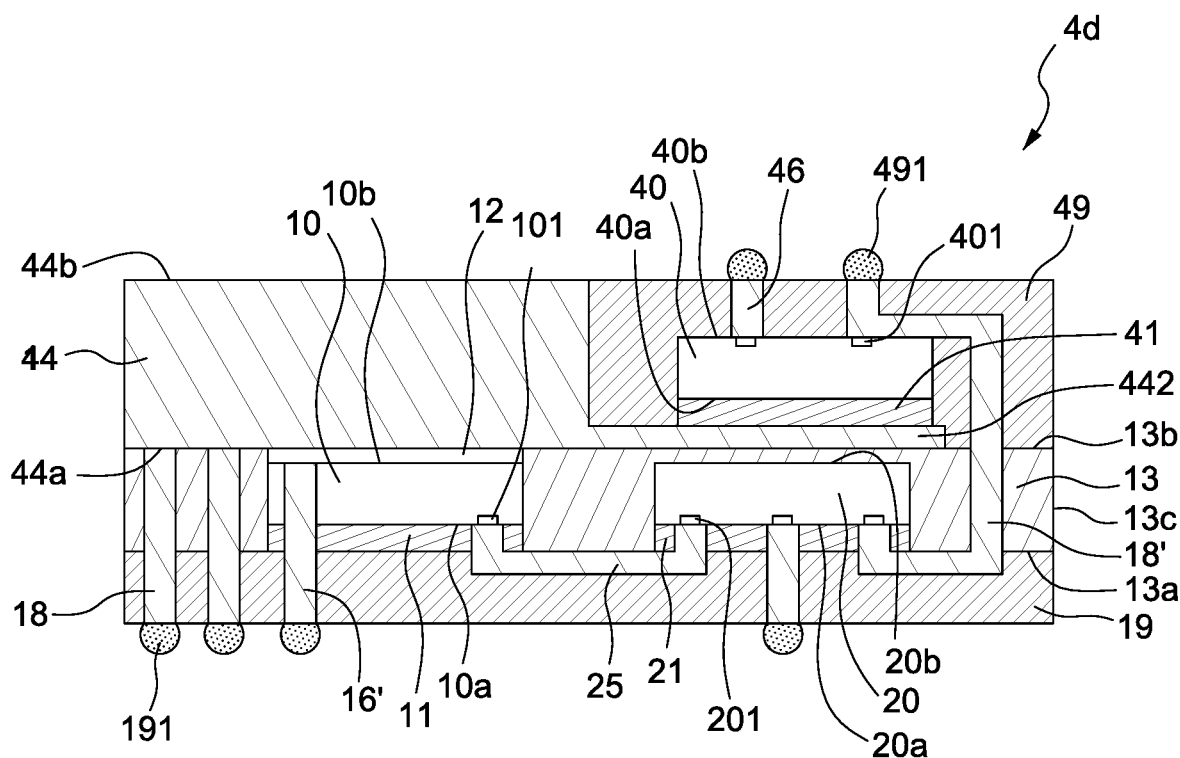

Referring to FIG. 4D, a semiconductor package device 4d is shown. The conductive layer 44 of the semiconductor package device 4d includes a portion 442 having a length such that the encapsulant layer 13 is partially exposed from the conductive layer 44. The exposed portion of the encapsulant layer 13 may provide flexibility in providing electrical routing; for example, the die 20 and the die 40 may be electrically connected by the conductive interconnect 18' that passes through the exposed portion without being short-circuited with the conductive layer 44.

Figure 5:
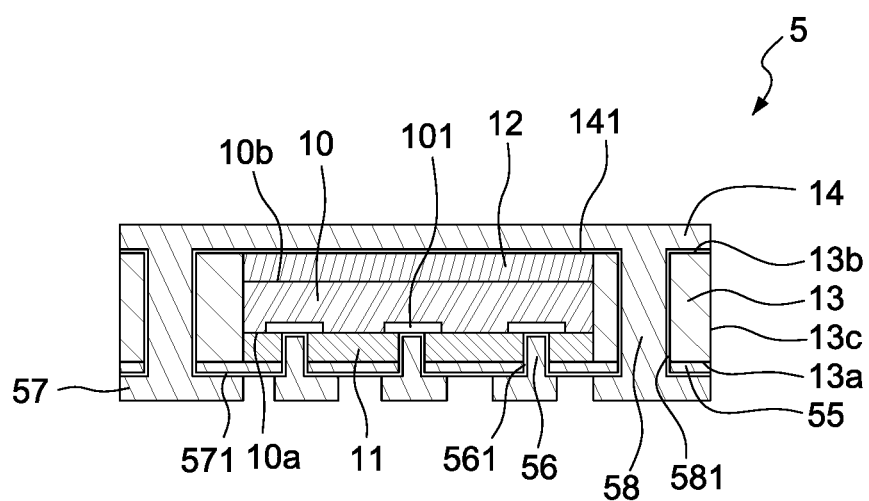
FIG. 5 illustrates a cross-sectional view of some embodiments of a semiconductor package device in accordance with a fourth aspect of the present disclosure.

FIG. 5 illustrates a cross-sectional view of some embodiments of a semiconductor package device 5 in accordance with a fourth aspect of the present disclosure. The semiconductor package device 5 includes a die 10 having an electrode 101, an adhesive layer 11 that exposes at least a portion of the electrode 101, a conductive layer 12, an encapsulant layer 13, a conductive layer 14, a patterned conductive layer 55, a conductive interconnect 56, a patterned conductive layer 57 and a conductive interconnect 58. Moreover, a seed layer 141 is disposed between the conductive layer 14 and the encapsulant layer 13; a seed layer 561 is disposed between the conductive interconnect 56 and the electrode 101, the adhesive layer 11, and the patterned conductive layer 55; a seed layer 571 is disposed between the patterned conductive layer 57 and the patterned conductive layer 55; and a seed layer 581 is disposed between the conductive interconnect 58 and the encapsulant layer 13 and the patterned conductive layer 15. In some embodiments, any one or more of the seed layer 141, the seed layer 561, the seed layer 571 and the seed layer 581 may be optional and thus omitted. The seed layer 141, the seed layer 561, the seed layer 571 and the seed layer 581 may include materials similar to or different from the seed layer 161.

The patterned conductive layer 55 is disposed on the encapsulant layer 13 and/or the adhesive layer 11, and may include materials similar to or different from the patterned conductive layer 15.

At least one conductive interconnect 56 may be disposed in the adhesive layer 11 and provide for electrical and/or thermal communication with the electrode 101 exposed from the adhesive layer 11. In some embodiments, the conductive interconnect 56 may include a conductive via or a conductive post. The conductive interconnect 56 may include materials similar to or different from the conductive interconnect 16. In some embodiments, the conductive interconnect 56 may protrude from the adhesive layer 11.

The patterned conductive layer 57 is disposed on the patterned conductive layer 55, and may include materials similar to or different from the patterned conductive layer 55. The patterned conductive layer 57 may serve to electrically connect different parts or components of the semiconductor package device 5. In some embodiments, part or all of the patterned conductive layer 57 may constitute one or more traces disposed on the semiconductor package device 5.

At least one conductive interconnect 58 may be disposed in the encapsulant layer 13 and provide for electrical and/or thermal communication to and from the conductive layer 14 through the encapsulant layer 13. In some embodiments, the conductive interconnect 58 may include a conductive via or a conductive post. The materials of the conductive interconnect 58 may be similar to the conductive interconnects 56 and/or the patterned conductive layer 57.

FIG. 6A, FIG. 6B, FIG. 6C, FIG. 6D, FIG. 6E, FIG. 6F, FIG. 6G and FIG. 6H illustrate a method of manufacturing a semiconductor package device in accordance with some embodiments of the present disclosure.

Figure 6A:
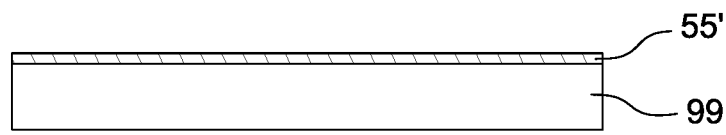
FIG. 6A, FIG. 6B, FIG. 6C, FIG. 6D, FIG. 6E, FIG. 6F, FIG. 6G and FIG. 6H illustrate a method of manufacturing a semiconductor package device in accordance with some embodiments of the present disclosure.

Referring to FIG. 6A, which is similar to FIG. 3A, a carrier 99 is provided, and a conductive layer 55' is disposed on the carrier 99. The conductive layer 55' may include materials similar to or different from the conductive layer 15'. The conductive layer 55' may be, for example, plated or sputtered.

Figure 6B:
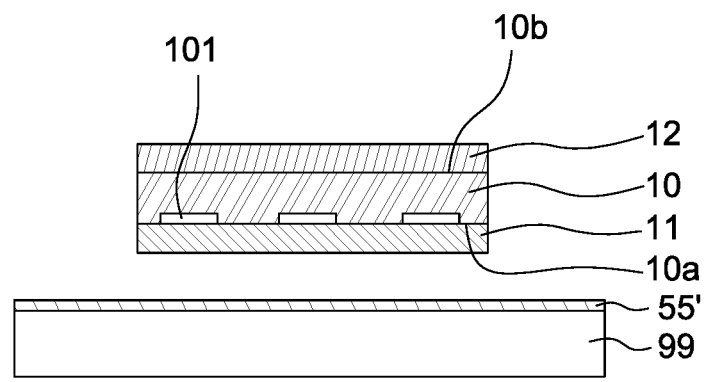

Referring to FIG. 6B, the die 10, the adhesive layer 11 and the (optional) conductive layer 12 are provided as a stack. Afterwards, the stack is attached to the carrier 99, as shown in FIG. 6B.

Figure 6C:
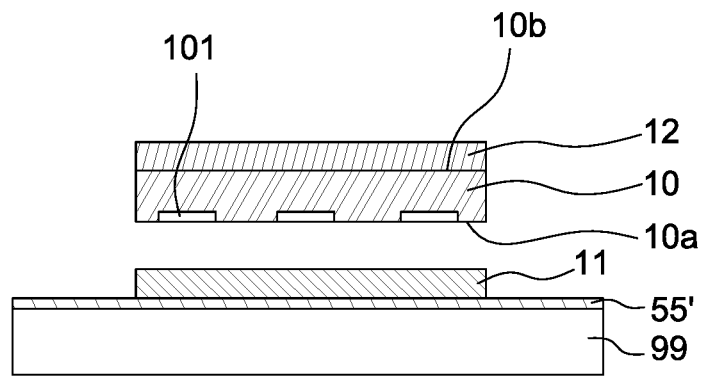
Figure 6D:
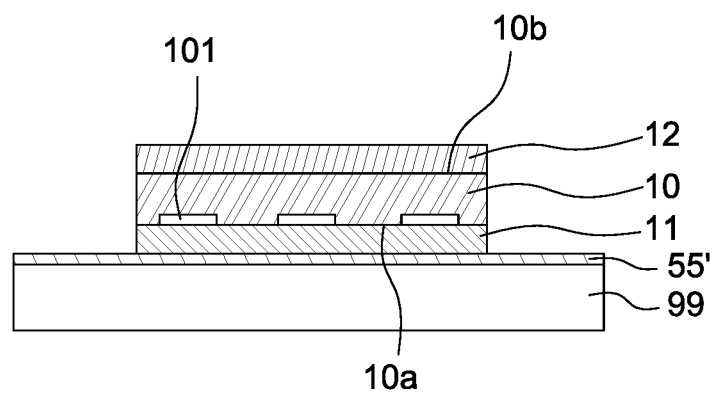

FIG. 6C illustrates an alternative stage of providing the die 10, the adhesive layer 11 and the (optional) conductive layer 12 on the carrier 99. In FIG. 6C, the adhesive layer 11 is provided on the carrier 99. Afterwards, the die 10 and the conductive layer 12 are attached to the adhesive layer 11, arriving at the structure shown in FIG. 6D.

Figure 6E:
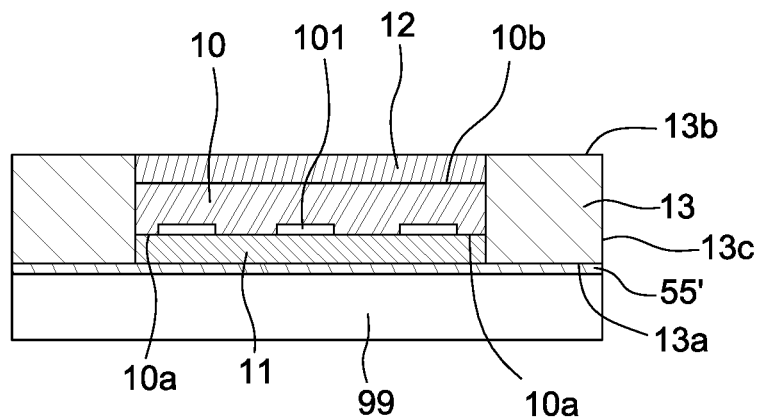

Referring to FIG. 6E, the encapsulant layer 13 is provided to encapsulate the die 10, the adhesive layer 11 and the conductive layer 12.

Figure 6F:
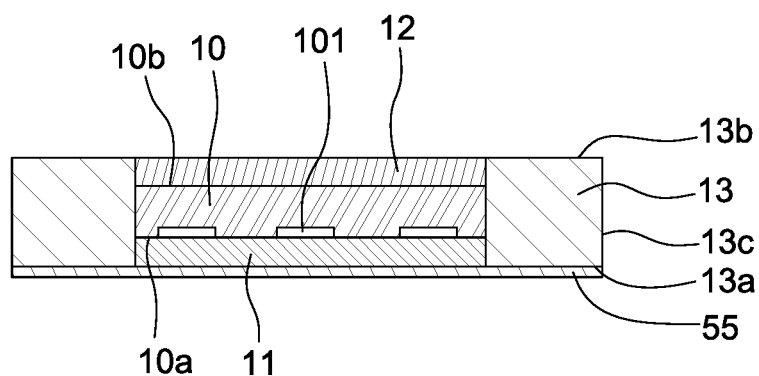

Referring to FIG. 6F, the carrier 99 is removed.

Figure 6G:
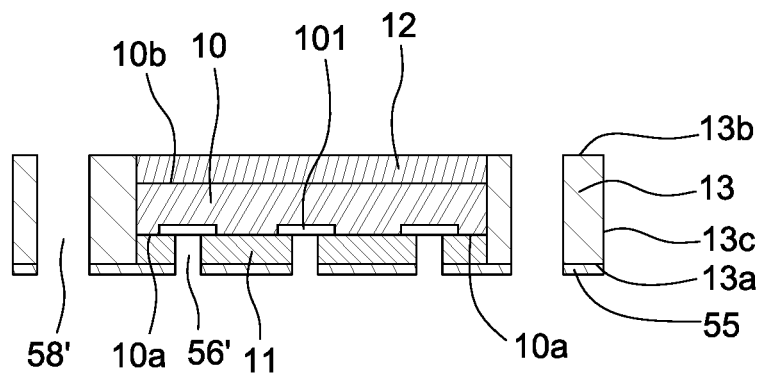

Referring to FIG. 6G, the opening 56' is formed by removing a portion of the adhesive layer 11 and the conductive layer 55'. The opening 58' is formed by removing a portion of the encapsulant layer 13 and the conductive layer 55'. The conductive layer 55' thus is patterned, and is referred to herein as a patterned conductive layer 55 after the formation of the openings 56' and 58'.

The opening 56' may be formed by, for example, photolithography techniques, laser ablation, etching (such as tent etch strip and strip flash etch) and drilling. In implementations in which materials of the adhesive layer 11 and the patterned conductive layer 55 differ from each other, it may be advantageous to employ different techniques to remove portions of different layers to form the opening 56'.

The opening 58' may be formed by, for example, photolithography techniques, laser ablation, etching (such as tent etch strip and strip flash etch) and drilling. In implementations in which the materials of the encapsulant layer 13 and the patterned conductive layer 55 differ from each other, it may be advantageous to employ different techniques to remove portions of different layers to form the opening 58'.

Figure 6H:
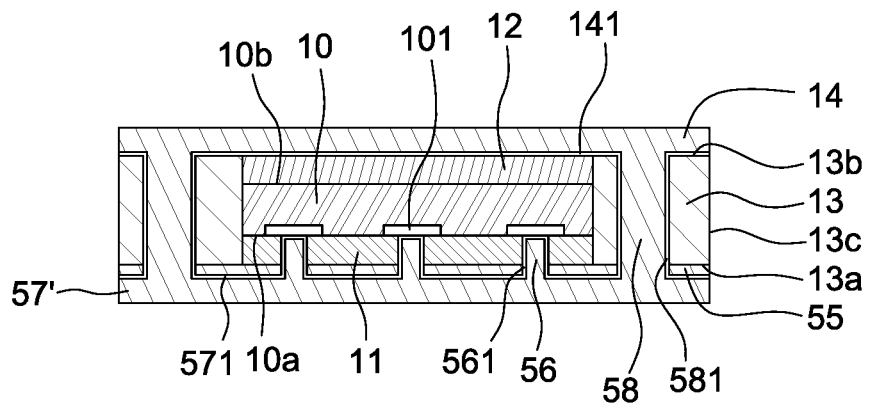

Referring to FIG. 6H, a seed layer 141 may be applied to the conductive layer 12 and the encapsulant layer 13; a seed layer 561 may be applied to in the opening 56'; a seed layer 571 may be applied to on the patterned conductive layer 55; and a seed layer 581 may be applied to in the opening 58'. The seed layers 141, 561, 571 and 581 may facilitate the manufacturing and/or growth of other materials thereon.

With or without the seed layers 141, 561, 571 and 581, a conductive layer 14, a conductive interconnect 56, a conductive layer 57' and a conductive interconnect 58 may be formed by, for example, plating (single-sided or double-sided, electro or electroless) or sputtering. The formation of the conductive layer 14, the conductive interconnect 56, the conductive layer 57' and the conductive interconnect 58 may be performed in any number of operations. For example, the formation may be performed in one single operation by, for example, double-sided plating.

Afterwards, the conductive layer 57' may be patterned to become a patterned conductive layer 57, thereby arriving at a semiconductor package device according to some embodiments of the present disclosure, such as the semiconductor package device 5.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a first die, having a first surface and a second surface opposite the first surface;
   an adhesive layer disposed on the first surface of the first die;
   an encapsulant layer encapsulating the first die and the adhesive layer;
   a first conductive via disposed in the adhesive layer and electrically connected to the first die;
   a mask layer disposed directly on the encapsulant layer and the adhesive layer;
   a patterned conductive layer disposed on the encapsulant layer and covered by the mask layer a second conductive via that extends through the adhesive layer and the mask layer and is exposed from the mask layer; and
   a conductive layer disposed on the second surface of the first die and exposed by the encapsulant layer; wherein
   the adhesive layer comprises a first material and the encapsulant layer comprises a second material different from the first material, and
   a surface of the adhesive layer is substantially coplanar with a surface of the encapsulant layer.

2. The semiconductor package device of claim 1, wherein the conductive layer covers substantially the entire second surface of the first die, wherein the conductive layer has a first surface and a second surface opposite to the first surface and exposed from the encapsulant layer, the first surface of the conductive layer directly contacts the second surface of the first die and the second surface of the conductive layer is substantially coplanar with a first surface of the encapsulant layer.

3. The semiconductor package device of claim 1, wherein the conductive layer is a first conductive layer, and the semiconductor package device further comprises a second conductive layer disposed on the encapsulant layer, wherein the second conductive layer covers substantially an entire surface of the encapsulant layer.

4. The semiconductor package device of claim 3, further comprising:
   a second conductive via disposed in the encapsulant layer and electrically connected to the patterned conductive layer and the second conductive layer.

5. The semiconductor package device of claim 1, further comprising a seed layer disposed between the adhesive layer and the first conductive via, wherein the seed layer is further disposed between the first die and the first conductive via.

6. The semiconductor package device of claim 5, wherein a surface of the first conductive via is exposed from the seed layer.

7. The semiconductor package device of claim 1, further comprising a connection element disposed on the mask layer, wherein the connection element is electrically connected to the first conductive via.

8. The semiconductor package device of claim 1, wherein the patterned conductive layer includes a portion extending beyond a side surface of the first die.

9. A semiconductor package device, comprising:
- a power device comprising a first conductive pad;
- an adhesive layer disposed on the power device;
- a package body encapsulating the power device and the adhesive layer;
- a conductive layer in thermal communication with the power device;
- a mask layer disposed on the package body and the adhesive layer;
- a first conductive post disposed in the adhesive layer and contacting the first conductive pad;
- a second conductive post that extends through the adhesive layer and the mask layer and is exposed from the mask layer; and
- a patterned conductive layer disposed on the package body and electrically connected to the first conductive post; wherein
- the adhesive layer comprises a first material and the package body comprises a second material different from the first material, and
- a surface of the adhesive layer is substantially coplanar with a surface of the package body.

10. The semiconductor package device of claim 9, wherein the adhesive layer is disposed along a perimeter of the power device.

11. The semiconductor package device of claim 9, further comprising a connection element disposed on the mask layer, wherein the connection element is electrically connected to the second conductive post.

12. The semiconductor package device of claim 9, further comprising a seed layer disposed between the patterned conductive layer and the first conductive pad, wherein a first surface of the first conductive post is exposed from the seed layer.

13. The semiconductor package device of claim 9, wherein the conductive layer covers substantially an entire surface of the package body.

14. The semiconductor package device of claim 9, further comprising a third conductive post disposed in the package body and electrically connected to the patterned conductive layer and the conductive layer.

15. The semiconductor package device of claim 14, further comprising a seed layer disposed between the third conductive post and the conductive layer.

16. The semiconductor package device of claim 15, wherein the seed layer is further disposed between the third conductive post and the package body.

17. A semiconductor package device, comprising:
- a die having a first surface and a second surface opposite to the first surface;
- an adhesive layer disposed on the first surface of the die;
- an encapsulant layer encapsulating the die and the adhesive layer;
- a first conductive interconnect disposed in the adhesive layer and electrically connected to the die;
- a first conductive layer disposed on the second surface of the die and having a first surface;
- a patterned conductive layer disposed on the encapsulant layer; and
- a mask layer disposed on the encapsulant layer and the adhesive layer;
- a second conductive interconnect extends through the adhesive layer and the mask layer and is exposed from the mask layer, wherein,
- the first surface of the first conductive layer is in direct contact with the second surface of the die,
- the adhesive layer comprises a first material and the encapsulant layer comprises a second material different from the first material, and
- a surface of the adhesive layer is substantially coplanar with a first surface of the encapsulant layer.

18. The semiconductor package device of claim 17, further comprising a seed layer disposed between the patterned conductive layer and the die, wherein:
the seed layer is further disposed between the adhesive layer and the conductive interconnect, and wherein the seed layer is further disposed between the die and the conductive interconnect.

19. The semiconductor package device of claim 17, further comprising a seed layer disposed between the patterned conductive layer and the die, wherein the conductive interconnect extends through the adhesive layer and includes a surface exposed by the seed layer.

20. The semiconductor package device of claim 17, wherein the first conductive layer covers substantially the entire second surface of the die, the first conductive layer has a second surface opposite to the first surface and exposed from the encapsulant layer, and the second surface of the first conductive layer is substantially coplanar with a second surface of the encapsulant layer.

21. The semiconductor package device of claim 17, further comprising a second conductive layer disposed on the encapsulant layer, wherein the second conductive layer covers substantially the entirety of a second surface of the encapsulant layer.

* * * * *